(12) United States Patent
Wu et al.

(10) Patent No.: US 9,218,262 B2
(45) Date of Patent: Dec. 22, 2015

(54) DYNAMIC MEMORY CELL REPLACEMENT USING COLUMN REDUNDANCY

(71) Applicant: Taiwan Semiconductor Manufacturing Co., Ltd., Hsin-Chu (TW)

(72) Inventors: Fu-An Wu, Hsinchu (TW); Jung-Ping Yang, Jui-bei (TW); Chia-En Huang, Xinfeng Township (TW); Cheng Hung Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 238 days.

(21) Appl. No.: 13/972,082

(22) Filed: Aug. 21, 2013

(65) Prior Publication Data

US 2015/0058664 A1 Feb. 26, 2015

(51) Int. Cl.
*G11C 29/00* (2006.01)
*G06F 11/25* (2006.01)

(52) U.S. Cl.
CPC ............... *G06F 11/25* (2013.01); *G11C 29/00* (2013.01)

(58) Field of Classification Search
CPC ..... G11C 29/808; G11C 29/50; G11C 11/401
USPC .................................................. 365/200, 201
See application file for complete search history.

(56) References Cited

U.S. PATENT DOCUMENTS

2009/0161429 A1* 6/2009 Chen et al. ............... 365/185.09

* cited by examiner

*Primary Examiner* — Huan Hoang
(74) *Attorney, Agent, or Firm* — Duane Morris LLP

(57) ABSTRACT

A memory chip comprises a main memory array having a plurality of memory columns, a redundancy memory column associated with the main memory array, and a hit logic circuitry configured to generate a plurality of hit logic signals by a plurality of hit logic units in the hit logic circuitry to enable dynamic replacement of a defective memory cell in one of the memory columns for dynamic replacement by the redundancy memory column when the memory array is in operation.

18 Claims, 6 Drawing Sheets

FIG. 4A

| FA<3> | FA<2> | THMCB<3> THMCA<3> | THMCB<2> THMCA<2> | THMCB<1> THMCA<1> | ENRED ENRED |
|---|---|---|---|---|---|
| 0 | 0 | 0 | 0 | 0 | 1 |
| 0 | 1 | 0 | 0 | 1 | 1 |
| 1 | 0 | 0 | 1 | 1 | 1 |
| 1 | 1 | 1 | 1 | 1 | 1 |

FIG. 4B

| | THMCC<8> | THMCC<7> | THMCC<6> | THMCC<5> | THMCC<4> | THMCC<3> | THMCC<2> | THMCC<1> | ENRED |
|---|---|---|---|---|---|---|---|---|---|
| FA<7> | 0 | 0 | 0 | 0 | 0 | 0 | 0 | 0 | 1 |
| FA<6> | 0 | 0 | 0 | 0 | 0 | 0 | 0 | 1 | 1 |
| FA<5> | 0 | 0 | 0 | 0 | 0 | 0 | 1 | 1 | 1 |
| FA<4> | 0 | 0 | 0 | 0 | 0 | 1 | 1 | 1 | 1 |
| | 0 | 0 | 0 | 0 | 1 | 1 | 1 | 1 | 1 |
| | 0 | 0 | 0 | 1 | 1 | 1 | 1 | 1 | 1 |
| | 0 | 0 | 1 | 1 | 1 | 1 | 1 | 1 | 1 |
| | 0 | 1 | 1 | 1 | 1 | 1 | 1 | 1 | 1 |
| | 1 | 1 | 1 | 1 | 1 | 1 | 1 | 1 | 1 |

FIG. 4C

DYNAMIC MEMORY CELL REPLACEMENT USING COLUMN REDUNDANCY

FIELD OF THE INVENTION

This disclosure relates to semiconductor memory devices generally, and more specifically to a memory chip having column redundancy for memory cell replacement.

BACKGROUND

Memory devices in the form of integrated circuit (IC) chips are typically provided as internal storage units in a computing or communication device. In general, memory devices contain an array of memory cells arranged in rows and columns for storing data, and row and column decoder circuits coupled to the array of memory cells for accessing the array of memory cells in response to an external address. Each column of memory cells in the memory devices can be coupled to one or more I/O bit lines each for read/write of data from a memory cell designated by the external address.

One type of memory chips used in the computing or communication devices is random-access memory (RAM), such as dynamic random-access memory (DRAM) that stores each bit of data in a separate capacitor within the memory chip, and static random-access memory (SRAM) that uses latching circuitry to store each bit of data. Both types of memory chips are volatile, meaning that content of the memory chips will be lost when the memory chips are not powered. Another type of memory chips used in the computing or communication devices is flash memory, which is an electronic non-volatile computer storage device that can be electrically erased and reprogrammed and can retain stored information even when the memory chips are not powered.

Since memory cells are more prone to defects than other IC chips used in the computing device, one or more columns of redundant memory cells are often included as a part of a memory chip for replacing any defective column and/or its elements (e.g., bit lines, etc.) so that a read/write operation can be performed properly on the memory chip after the memory repair/replacement with the redundant memory columns.

BRIEF DESCRIPTION OF THE DRAWINGS

FIGS. 4A and 4B show output signals via thermal coding from two and four input signals, respectively; FIG. 4C shows an example of nested thermal coding of the input signals to hit logic circuitry to cover the memory columns of memory array shown in FIG. 1.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

The inventors have discovered that a memory chip design having a main memory array, a redundancy column and a hit logic circuitry with one hit generation circuit for each of the I/O bit line of the memory array enables dynamic replacement of defective memory cells in the memory array. When the memory chip is in operation (e.g., powered on for a read/write operation to be performed on a memory cell in the memory chip during a portion of a clock cycle), the hit logic circuitry enables and checks the I/O bit lines of the memory array bit-by-bit during the time when a read/write operation is not being performed on the memory array to determine if any of the memory cells in the memory array is defective. If a failed/defective memory cell is identified, a corresponding column or bit line is chosen from the redundancy column to replace the column/bit line containing the defective memory cell. Special coding is adopted for the hit logic circuitry to make sure that any defective memory cell can be dynamically replaced quickly enough during the operation of the memory chip (instead of predetermined before the memory chip is in operation) before the next read/write operation is performed on the memory array.

Figure 1:
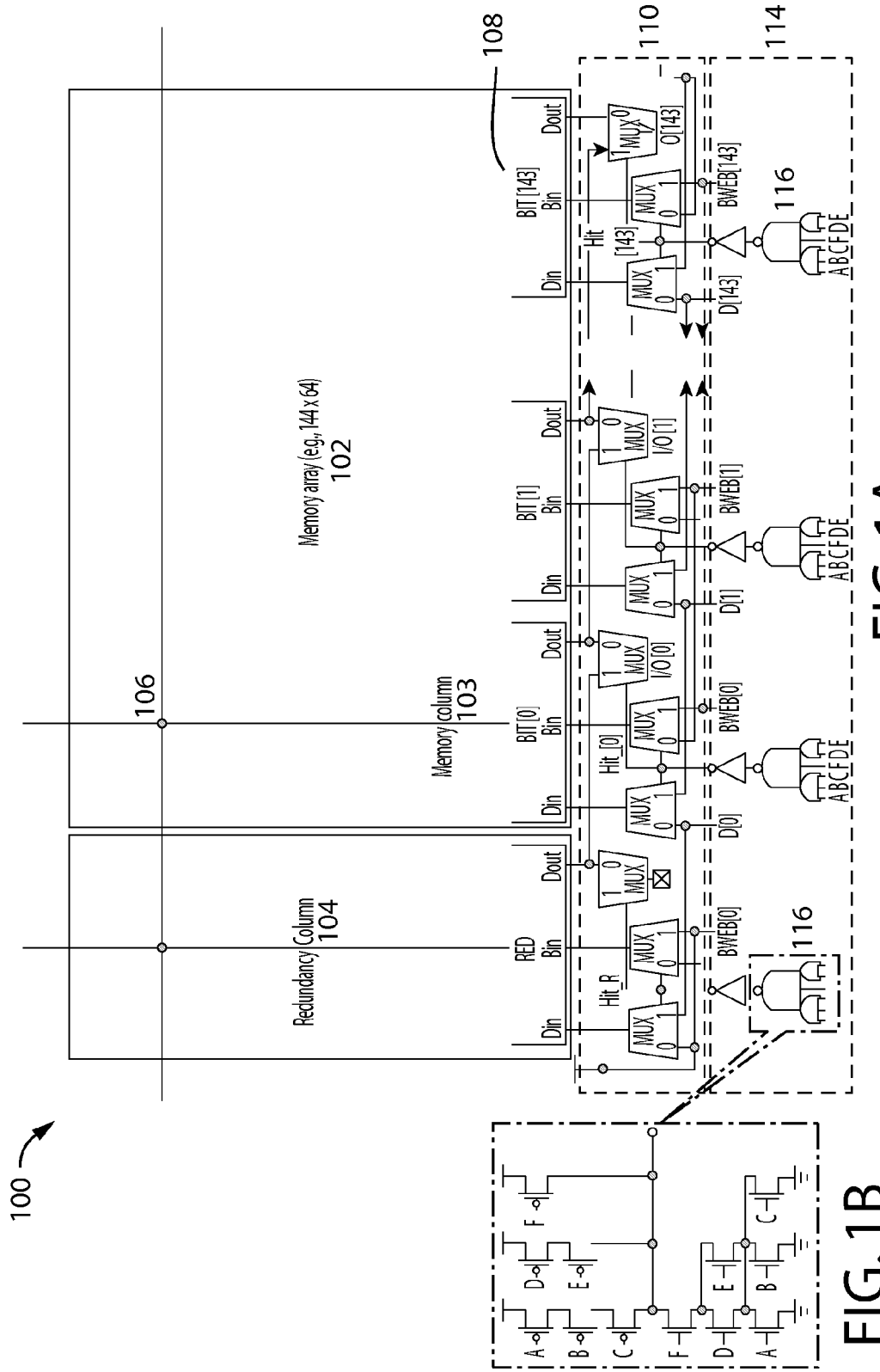
FIG. 1A shows schematic view of an example of a memory chip having a redundancy column and a hit logic circuitry for dynamic memory cell replacement.
FIG. 1B shows an expanded view of an example of a hit logic unit.

FIG. 1A shows schematic view of an example of a memory chip 100 having a redundancy column and a hit logic circuitry for dynamic memory cell replacement. As shown in FIG. 1A, memory chip 100 includes at least main memory array 102 having a plurality of memory columns 103, redundancy (memory) column 104, read/write (R/W) circuitry 110, and hit logic circuitry 114. Here, the type of memory array 102 and redundancy column 104 can be, but is not limited to, DRAM, SRAM, flash memory, or any other type of memory suitable to be used with a computing or communication device. Both memory columns 103 and redundancy column 104 each includes a plurality of memory cells 106 arranged in rows and columns (In the example of FIG. 1, memory array 102 may include 64 rows and 144 columns), wherein each of the memory cells stores one or more bits of data. Memory columns 103 and redundancy column 104 further include a plurality of I/O units (I/Os) 108 each corresponding to a bit line BIT[n] of a memory column 103 (or RED of redundancy column 104) for reading a bit of data from and/or writing a bit of data to memory cell 106. Each of the I/O units 108 includes a data input pin (Din) for writing a bit of data to the memory cell 106, a data output pin (Dout) for reading a bit of data from the memory cell 106, and bit line enabling pin (Bin) for enabling the read/write operation to the memory cell 106.

In the example of FIG. 1A, R/W circuitry 110 includes a plurality of R/W units 112, each corresponding to one of the I/O units 108 to provide the bit of data to be written to memory cell 106 to Din, to accept the data read from memory cell 106 from Dout, and to generate and provide the R/W enabling signal to Bin via a plurality of multiplexers (MUXs). The operations of the plurality of R/W units 112 in the R/W circuitry 110 are controlled by hit logic signals Hit[0] . . . Hit[n] and Hit_R corresponding to the bit lines BIT[0]-BIT[n] and RED, respectively, wherein a specific bit line in a memory column is selected for inspection of possible defects when the corresponding hit logic signal is at a first logic state (e.g., high/ON or logic "1"). The hit logic signals are each generated by one of the hit logic units 116 in hit logic circuitry 114, wherein each of the hit logic units 116 includes a plurality gates that take a plurality of encoded signals as input to generate the hit logic signal. The encoding of the input signals to hit logic units 116 is discussed in detail later. In some embodiments, as shown in an expanded view of an example of hit logic unit 116 in FIG. 1B, each hit logic unit 116 may be implemented as a combinational logic including two OR gates and one NAND gate in an OR-NAND gate structure having a total number of 12 (CMOS) gates.

Figure 2:
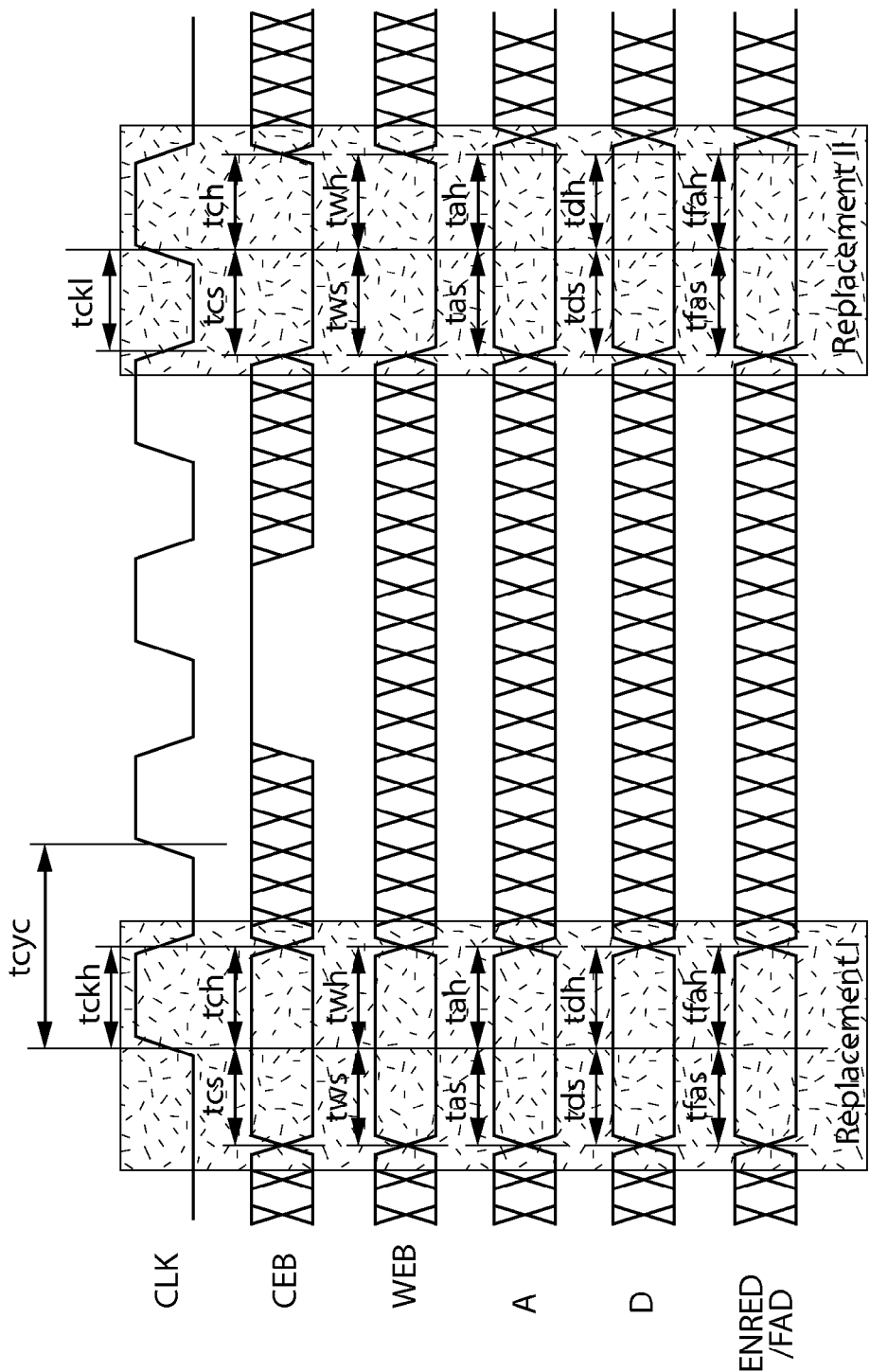
FIG. 2 shows an example of timing sequences of a plurality of signals for dynamic memory cell replacement using a redundancy column during the operation of a memory chip.

FIG. 2 shows an example of timing sequences of a plurality of signals for dynamic memory cell replacement using a redundancy column during the operation of memory chip 100. As shown in the example of FIG. 2, CLK is a (binary) clock signal wherein a read/write operation to a memory cell 106 can only be performed when the clock signal is high (logic "1") during time tckh of a clock cycle (tcyc). CEB is the clock enabling signal that enables the read/write operation to memory cell 106 to be performed during certain period tcs of a clock cycle. WEB is the enabling signal for the read/write operation to memory cell 106. "A" represents the address lines of the designated memory cell 106 and "D" represents the data to be read from or written to the memory cell. ENRED is the replacement enabling signal for redundancy column 104 and FAD is the address of the I/O bit line which is defective and needs to be replaced. The replacement of defective memory cells must be performed during tcs (tfas/tas) period of the clock cycle when the clock signal is at a second logic state (e.g., low/OFF or logic "0") before the next read/write operation is performed on memory chip 100 during tckh (tah/tfah) period of the clock cycle.

When memory chip 100 is in operation, e.g., when memory chip 100 is powered on, hit logic units 116 of hit logic circuitry 114 generate hit logic signals Hit[0]-Hit[n] that "hits" one or more of the plurality of bit lines of the memory columns for dynamic replacement of any defective memory cells during the time period before a read/write operation is being performed on the memory chip. If any of the memory cells is defective, the memory column containing the defective memory cell is designated for replacement. As a result, the designated memory column will be replaced with the redundancy memory column by reasserting the address of the defective column to the redundancy memory column. Such memory cell/column replacement is dynamic because the memory column is replaced during on-time of memory chip 100 when memory chip 100 is powered on and in operation instead of being predetermined at off-time of memory chip 100 and unchangeable during its on-time. Note that the discovery and replacement of the defective memory cell/column needs to be completed during failed address setup time (tfas) before CLK turns high and the next read/write operation to the memory cell is to be performed.

Figure 3:
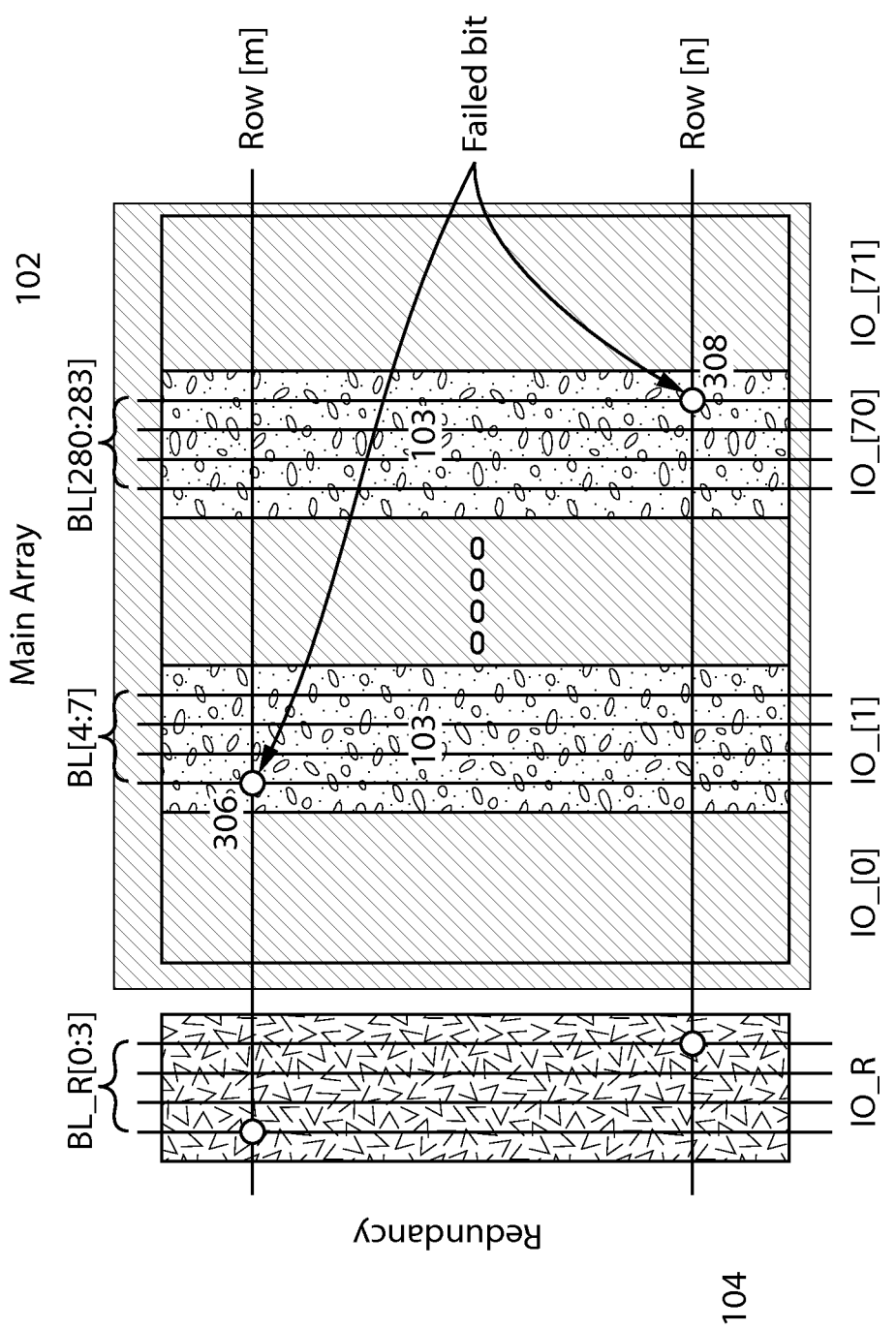
FIG. 3 shows an example of a memory array and a redundancy column wherein each column has multiple bit lines.

In some embodiments, each column in memory array 102 and redundancy column 104 may include a plurality of bit lines. As shown in the example of FIG. 3, each group of IO[0]-IO[n] and IO_R corresponds to a memory column 103 having 4 bit lines, e.g., redundancy column 104 has bit lines BL_R[0:3]. Under such multiple bit lines per column memory configuration, different (defective) memory columns can share the one redundancy column 104. When a defective memory cell on a bit line in one of those memory columns 103 is identified, a corresponding bit line in redundancy column 104 (instead of the entire redundancy column 104) can be dynamically asserted and selected to replace the defective memory cell/bit line. Since only one bit line from redundancy column 104 is used to replace the bit line having the defective memory cell, remaining bit lines of redundancy column 104 are still be available to be used to replace other bit lines having defective memory cells. In the example shown in FIG. 3, BL_R[0] of redundancy column 104 can be used to replace BL[0], BL[4], . . . BL [280], .and BL_R[3] of redundancy column 104 can be used to replace BL[3], BL[7], . . . , BL [283], respectively. When a first defective memory cell 306 at Row[m], BL[4] of IO[1] is identified, a corresponding bit line BL_R[0] in redundancy column 104 can be asserted to replace the defective bit line BL[4] in column IO[1]. If a second defective memory cell 308 is later identified at Row [n], BL[283] of IO[70], a corresponding bit line BL_R[3] in redundancy column 104 can be asserted to replace the defective bit line BL[283] in column IO[70]. As such, a single redundancy column 104 having multiple bit lines can be utilized to replace multiple defective memory cells/bit lines in main memory array 102.

As discussed above, dynamic replacement of the defective memory cells/columns using the redundancy column needs be done quickly within failed address setup time (tfas) before CLK turns high to ensure that read/write operation to the memory cell can be performed properly. If hit logic signals are generated by the hit logic units 116 using exact binary codes as shown in top portion of FIG. 4C to turn on each of the bit lines one by one, i.e., only one of hit logic signals is set to logic "1" at any time while the remaining hit logic signals are set to logic "0", then shifting the hit signals through the hit logic units 116 to check the memory columns/bit lines one by one from one end to another (e.g., from BIT[0] to BIT[143] as shown in FIG. 1) will take a long time that far exceeds tfas due to long propagation delays through the gates of hit logic circuitry 114, making dynamic memory cell replacement impossible.

In some embodiments, thermometer or thermal coding is adopted by hit logic units 116 of hit logic circuitry 114 to generate the hit logic signals HIT[0]-HIT[n]. Unlike binary coding where one group of input signals generates exactly one hit among all of the hit logic signals at any time, thermometer coding enables one or more groups of input signals to generate multiple output or hits of logic "1" among all of the hit logic signals at any time. For a non-limiting example as shown in FIG. 4A, two binary input signals may generates four sets of thermal-coded output signals each having multiple logic "1"s or "hits." Since multiple memory columns/bit lines can be dynamically replaced for faults or defects in parallel (at the same time) with multiple hit logic signals being generated as "hits" by hit logic circuitry 114, dynamic replacement of defective memory cell in memory array 102 can be completed quickly enough to be within tfas before the next read/write operation is performed on memory array 102 within the same clock cycle. The thermal coding of the output signals from four input signals is shown in FIG. 4B.

Figure 4C:
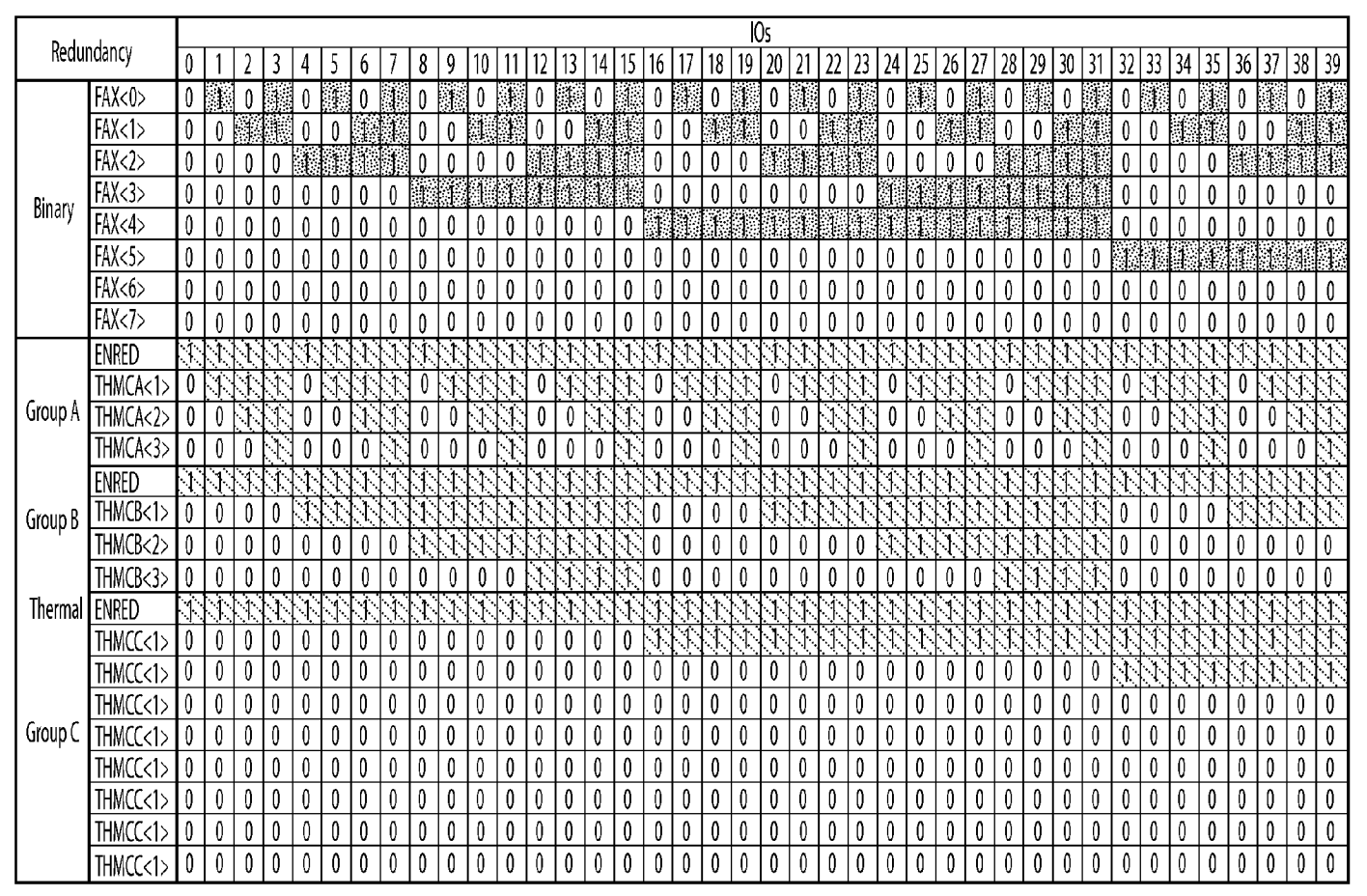

In some embodiments, nested thermometer or thermal coding is adopted by hit logic circuitry 114 wherein the input signals to hit logic circuitry 114 are organized into a plurality of groups at different levels in a hierarchy, each having a plurality of binary inputs and the thermal-coded output signals from one group of input signals is "nested" or repeated when the output signals from another group of input signals at a higher level changes. FIG. 4C shows an example of nested thermal coding of the input signals to hit logic circuitry 114 to cover the memory columns of memory array 102 shown in FIG. 1. Here, the eight input signals needed in order to cover all 144 memory columns of memory array 102 are organized into three groups—Group A and Group B each has two input signals generating four output signals THMCA[3:0], THMCB[3:0] as shown in FIG. 4A and Group C has four input signals generating nine (out of possible sixteen as shown in FIG. 4B) output signals THMCC[8:0] under thermal coding. As shown in FIG. 4C, the output signals from Group A, B, and C under nested thermal coding can be expressed in a nested loop as:

For Group C output THMCC[8:0] from 000000001 to 111111111
   For Group B output THMCB[3:0] from 0001 to 1111
      For Group A output THMCA[3:0] from 0001 to 1111

Where THMCA[0], THMCB[0], and THMCC[0] can all share the same redundancy column enabling signal ENRED to reduce routing of the signals.

Figure 5:
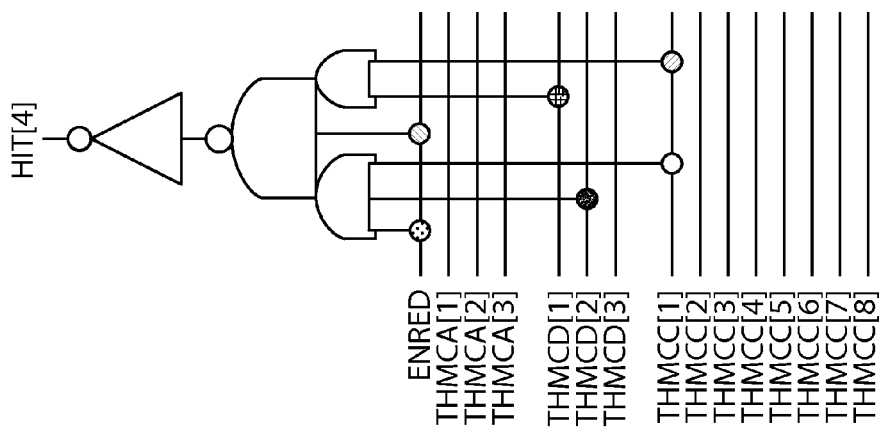
FIG. 5 shows an example of a hit logic unit implemented based on nested thermal coding.

In some embodiments, the three groups of nested thermal coding described above enables each hit logic unit 116 to be implemented using a compact combinational logic such as an OR-NAND gate structure comprising two OR gates and one NAND gate with a total number of 12 (CMOS) gates as shown in FIG. 1B. Here, the hit logic function for each of the hit logic signals HIT[n], n=0 . . . 144, can be expressed as:

$$HIT[n] = \{A[\text{remainder}(n,4)] + B[\text{quotient}(n,4)+1] + C[\text{quotient}(n,16)+1]\} * \{B[\text{quotient}(n,4)] + C[\text{quotient}(n,16)+1]\} * C[\text{quotient}(n,16)]$$

Where A, B, C represents output signals THMCA, THMCB, and THMCC from Group A, B, and C, respectively. In the example as shown in FIG. 5, HIT[4] generated by hit logic unit 116 using nested thermal coding can be expressed as:

$$HIT[4] = (A[0] + B[2] + C[1]) * (B[1] + C[1]) * C[0]$$

where A[0] and C[0] share the same ENRED signal, B[1] and B[2] correspond to THMCB[1] and THMCB[2], respectively, and C[1] corresponds to THMCC[1].

Such compact OR-NAND gate structure greatly reduces the number of gates needed to implement hit logic units 116 in hit logic circuitry 114, which leads to the reduction in propagation delay of hit logic circuitry 114. The sharing of redundancy column enabling signal ENRED further simplifies the routing of hit logic circuitry 114. As a result, hit logic circuitry 114 enables dynamic replacement defective memory cells to be done fast enough within tfas so that read/write operations can be performed on memory array 102 properly.

Figure 6:
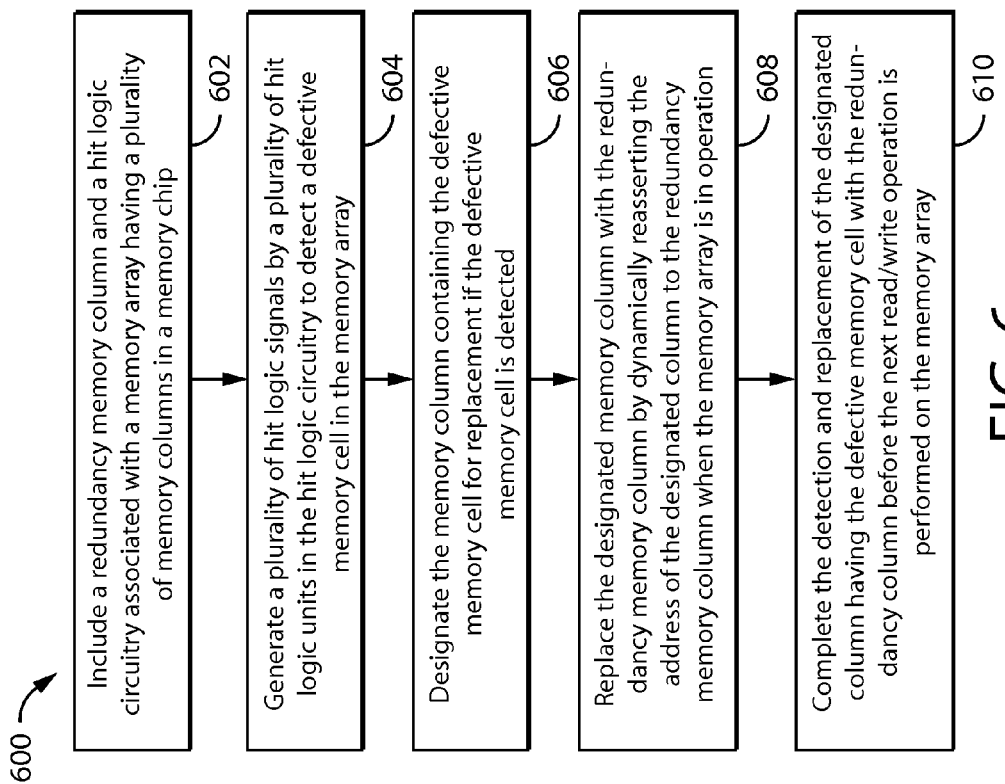
FIG. 6 is a flow chart of a method for dynamic replacement of defective memory cells in a memory array of a memory chip using a redundancy column during the time period when the memory chip is in operation but before a read/write operation is being performed on the memory chip.

FIG. 6 is a flow chart 600 of a method for dynamic replacement of defective memory cells in a memory array of a memory chip using a redundancy column during the time period when the memory chip is in operation but before a read/write operation is being performed on the memory chip.

At step 602, a redundancy memory column and a hit logic circuitry associated with a memory array having a plurality of memory columns are included in a memory chip.

At step 604, a plurality of hit logic signals are generated by a plurality of hit logic units in the hit logic circuitry to enable dynamic replacement of a defective memory cell in the memory array.

At step 606, the memory column containing the defective memory cell is designated for replacement if the defective memory cell is identified.

At step 608, the designated memory column is replaced with the redundancy memory column by dynamically reasserting the address of the designated column to the redundancy memory column when the memory array is in operation.

At step 610, the replacement of the designated column having the defective memory cell with the redundancy column is completed before the next read/write operation is performed on the memory array.

In some embodiments, a method performed with a memory chip having a memory array having a plurality of memory columns comprises generating a plurality of hit logic signals by a plurality of hit logic units in a hit logic circuitry associated with the memory array to enable dynamic replacement of a defective memory cell in one of the memory columns. The method further comprises designating the memory column containing the defective memory cell for replacement if the defective memory cell is identified and replacing the designated memory column with a redundancy memory column by dynamically reasserting the address of the designated column to the redundancy memory column when the memory array is in operation. The dynamic replacement of the designated column having the defective memory cell with the redundancy column is completed before the next read/write operation is performed on the memory array.

In some embodiments, the method further comprises testing one of the plurality of memory columns for defective memory cell when the corresponding hit logic signal is at a first logic state.

In some embodiments, the method further comprises replacing the defective memory cell when clock signal of the memory chip is at a second logic state.

In some embodiments, the method further comprises adopting nested thermometer coding of input signals to the hit logic circuitry to generate the plurality of hit logic signals to enable more than one of the memory columns be tested for defects at the same time.

In some embodiments, the method further comprises organizing the input signals to the hit logic circuitry into a plurality of groups at different levels in a hierarchy, wherein each of the groups has a plurality of binary inputs and thermal-coded output signals from one group of input signals is repeated when output signals from another group of input signals at a higher level changes.

In some embodiments, the method further comprises reducing routing of the output signals from the plurality of groups by sharing one or more of the output signals from the groups.

In some embodiments, the method further comprises implementing each of plurality of the hit logic units in the hit logic circuitry using a combination logic based on nested thermometer coding of the input signals to the hit logic circuitry.

In some embodiments, the method further comprises implementing each of plurality of the hit logic units as an OR-NAND gate structure.

In some embodiments, a method performed with a memory chip having a memory array having a plurality of memory columns, wherein each of the memory columns has a plurality of bit lines comprises generating a plurality of hit logic signals by a hit logic circuitry associated with the memory array to enable dynamic replacement of a first defective memory cell in the memory array when the memory array is in operation. The method further comprises designating a first bit line containing the first defective memory cell in one of the memory columns for replacement if the first defective memory cell is identified and replacing the first designated bit line with a corresponding first bit line in a redundancy memory column by dynamically reasserting the address of the first designated bit line to the first bit line in the redundancy memory column. The dynamic replacement of the first designated bit line having the defective memory cell with the first bit line in the redundancy column is completed before the next read/write operation is performed on the memory array.

In some embodiments, the method further comprises designating a second bit line containing a second defective memory cell in one of the memory columns for replacement if the second defective memory cell is identified and replacing the second designated bit line with a corresponding second bit line in the redundancy memory column by dynamically reasserting the address of the second designated bit line to the second bit line in the redundancy memory column.

In some embodiments, the method further comprises that the first and the second bit line in the redundancy memory column are different.

In some embodiments, a memory chip comprises a main memory array having a plurality of memory columns, a redundancy memory column associated with the main memory array, and a hit logic circuitry configured to generate a plurality of hit logic signals by a plurality of hit logic units in the hit logic circuitry to enable dynamic replacement of a defective memory cell in one of the memory columns for dynamic replacement by the redundancy memory column when the memory array is in operation.

In some embodiments, each of the plurality of memory columns and the redundancy memory column has one or more bit lines.

In some embodiments, the hit logic circuitry is configured to generate the plurality of hit logic signals to enable dynamic replacement of more than one defective memory cells in one or more of the memory columns for dynamic replacement when the memory array is in operation.

In some embodiments, the redundancy memory column is configured to provide more than one bit lines to dynamically replace the more than one defective memory cells when the memory array is in operation.

In some embodiments, the hit logic circuitry is configured to adopt nested thermometer coding of input signals to the hit logic circuitry to generate the plurality of hit logic signals to enable more than one of the memory columns be tested for defects at the same time.

In some embodiments, the hit logic circuitry is configured to take the input signals in a plurality of groups at different levels in a hierarchy, wherein each of the groups has a plurality of binary inputs and thermal-coded output signals from one group of input signals is repeated when output signals from another group of input signals at a higher level changes.

In some embodiments, the hit logic circuitry is configured to generate and share one or more of the output signals from the plurality of groups.

In some embodiments, each of plurality of the hit logic units in the hit logic circuitry is a combination logic implemented based on nested thermometer coding of the input signals to the hit logic circuitry.

In some embodiments, each of plurality of the hit logic units in the hit logic circuitry is an OR-NAND gate structure implemented based on nested thermometer coding of the input signals to the hit logic circuitry.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method performed with a memory chip having a memory array having a plurality of memory columns, comprising:

applying nested thermometer coding of input signals to a hit logic circuitry to generate a plurality of hit logic signals to enable more than one of the memory columns to be tested for defects at the same time;

generating said plurality of hit logic signals by a plurality of hit logic units in the hit logic circuitry associated with the memory array to enable dynamic replacement of a defective memory cell in one of the memory columns;

designating the memory column containing the defective memory cell for replacement if the defective memory cell is identified;

replacing the designated memory column with a redundancy memory column by dynamically reasserting the address of the designated column to the redundancy memory column when the memory array is in operation;

wherein the dynamic replacement of the designated column having the defective memory cell with the redundancy column is completed before the next read/write operation is performed on the memory array.

2. The method of claim 1, further comprising:
testing one of the plurality of memory columns for defective memory cell when the corresponding hit logic signal is at a first logic state.

3. The method of claim 1, further comprising:
replacing the defective memory cell when clock signal of the memory chip is at a second logic state.

4. The method of claim 1, further comprising:
organizing the input signals to the hit logic circuitry into a plurality of groups at different levels in a hierarchy, wherein each of the groups has a plurality of binary inputs and thermal-coded output signals from one group of input signals is repeated when output signals from another group of input signals at a higher level changes.

5. The method of claim 4, further comprising:
reducing routing of the output signals from the plurality of groups by sharing one or more of the output signals from the groups.

6. The method of claim 4, further comprising:
implementing each of plurality of the hit logic units in the hit logic circuitry using a combination logic based on nested thermometer coding of the input signals to the hit logic circuitry.

7. The method of claim 6, further comprising:
implementing each of plurality of the hit logic units as an OR-NAND gate structure.

8. A method performed with a memory chip having a memory array having a plurality of memory columns, wherein each of the memory columns has a plurality of bit lines, comprising:

applying nested thermometer coding of input signals to a hit logic circuitry to generate a plurality of hit logic signals to enable more than one of the memory columns to be tested for defects at the same time;

generating said plurality of hit logic signals by the hit logic circuitry associated with the memory array to enable dynamic replacement of a first defective memory cell in the memory array when the memory array is in operation;

designating a first bit line containing the first defective memory cell in one of the memory columns for replacement if the first defective memory cell is identified;

replacing the first designated bit line with a corresponding first bit line in a redundancy memory column by dynamically reasserting the address of the first designated bit line to the first bit line in the redundancy memory column;

wherein the dynamic replacement of the first designated bit line having the defective memory cell with the first bit line in the redundancy column is completed before the next read/write operation is performed on the memory array.

9. The method of claim 8, further comprising:
designating a second bit line containing a second defective memory cell in one of the memory columns for replacement if the second defective memory cell is identified;
replacing the second designated bit line with a corresponding second bit line in the redundancy memory column by dynamically reasserting the address of the second designated bit line to the second bit line in the redundancy memory column.

10. The method of claim 9, wherein:
the first and the second bit line in the redundancy memory column are different.

11. A memory chip, comprising:
a main memory array having a plurality of memory columns;
a redundancy memory column associated with the main memory array; and
a hit logic circuitry configured to generate a plurality of hit logic signals by a plurality of hit logic units in the hit logic circuitry to enable dynamic replacement of a defective memory cell in one of the memory columns for dynamic replacement by the redundancy memory column when the memory array is in operation;
wherein the hit logic circuitry is configured to apply nested thermometer coding of input signals to the hit logic circuitry to generate the plurality of hit logic signals to enable more than one of the memory columns to be tested for defects at the same time.

12. The memory chip of claim 11, wherein:
each of the plurality of memory columns and the redundancy memory column has one or more bit lines.

13. The memory chip of claim 11, wherein:
the hit logic circuitry is configured to generate the plurality of hit logic signals to enable dynamic replacement of more than one defective memory cells in one or more of the memory columns for dynamic replacement when the memory array is in operation.

14. The memory chip of claim 13, wherein:
the redundancy memory column is configured to provide more than one bit lines to dynamically replace the more than one defective memory cells when the memory array is in operation.

15. The memory chip of claim 11, wherein:
the hit logic circuitry is configured to take the input signals in a plurality of groups at different levels in a hierarchy, wherein each of the groups has a plurality of binary inputs and thermal-coded output signals from one group of input signals is repeated when output signals from another group of input signals at a higher level changes.

16. The memory chip of claim 15, wherein:
the hit logic circuitry is configured to generate and share one or more of the output signals from the plurality of groups.

17. The memory chip of claim 15, wherein:
each of plurality of the hit logic units in the hit logic circuitry is a combination logic implemented based on nested thermometer coding of the input signals to the hit logic circuitry.

18. The memory chip of claim 17, wherein:
each of plurality of the hit logic units in the hit logic circuitry is an OR-NAND gate structure implemented based on nested thermometer coding of the input signals to the hit logic circuitry.

\* \* \* \* \*